United States Patent
Roizin et al.

(10) Patent No.: US 7,800,156 B2
(45) Date of Patent: Sep. 21, 2010

(54) ASYMMETRIC SINGLE POLY NMOS NON-VOLATILE MEMORY CELL

(75) Inventors: Yakov Roizin, Migdal Haemek (IL); Evgeny Pikhay, Migdal Haemek (IL); Ishai Naveh, San-Jose, CA (US)

(73) Assignee: Tower Semiconductor Ltd., Migdal Haemek (IL)

( * ) Notice: Subject to any disclaimer, the term of this patent is extended or adjusted under 35 U.S.C. 154(b) by 247 days.

(21) Appl. No.: 12/037,051

(22) Filed: Feb. 25, 2008

(65) Prior Publication Data
US 2009/0212342 A1 Aug. 27, 2009

(51) Int. Cl.
H01L 29/788 (2006.01)
(52) U.S. Cl. .............................. 257/315; 257/E21.422
(58) Field of Classification Search ................ 257/314, 257/322, E21.422, 315
See application file for complete search history.

(56) References Cited

U.S. PATENT DOCUMENTS

| | | | |
|---|---|---|---|
| 5,051,951 A | 9/1991 | Maly et al. | |
| 5,188,976 A | 2/1993 | Kume et al. | |
| 5,354,703 A | 10/1994 | Gill | |
| 5,455,789 A | 10/1995 | Nakamura et al. | |
| 5,646,430 A | 7/1997 | Kaya et al. | |
| 5,687,115 A * | 11/1997 | Wong et al. | 365/185.03 |
| 5,777,361 A * | 7/1998 | Parris et al. | 257/322 |
| 6,678,190 B2 | 1/2004 | Yang et al. | |
| 6,905,929 B1 | 6/2005 | Merrill et al. | |
| 7,033,891 B2 | 4/2006 | Wilson et al. | |
| 7,078,761 B2 | 7/2006 | Wang et al. | |
| 7,177,185 B2 | 2/2007 | Jung | |
| 7,209,392 B2 | 4/2007 | Chen et al. | |
| 7,227,234 B2 | 6/2007 | Roizin et al. | |
| 7,312,499 B2 | 12/2007 | Iwata et al. | |
| 7,372,097 B2 | 5/2008 | Forbes et al. | |
| 7,388,783 B2 | 6/2008 | Sakui | |
| 7,427,791 B2 | 9/2008 | Matsuzaki et al. | |

(Continued)

OTHER PUBLICATIONS

Roizin et al.: "Low-Cost Embedded NVM For Power Management Designs", Tower Semiconductor, Ecnmag.com, Oct. 1, 2008, 3 pages.

(Continued)

*Primary Examiner*—Jerome Jackson, Jr.
*Assistant Examiner*—Paul A Budd
(74) *Attorney, Agent, or Firm*—Bever, Hoffman & Harms, LLP; Patrick T. Bever

(57) ABSTRACT

An asymmetric non-volatile memory (NVM) cell for a CMOS IC formed by a standard CMOS process flow used to form both low voltage and high voltage transistors on a substrate. The NVM cell includes an NMOS floating gate transistor and an optional select transistor. The floating gate transistor includes an elongated floating gate having a first portion disposed over the channel region $C_{150}$, a second portion extending into an enlarged drain diffusion area $D_{150}$ away from the channel region, whereby the gate-to-drain capacitance is higher than the gate-to-source capacitance. The width of the floating gate extension portion is minimized, while both HV LDD and LV LDD implants are introduced together enabling LDD implant merging under the floating gate extension. HV LDD implant in the NVM transistor is replaced by LV LDD. The floating gate is formed using substantially U-shaped or J-shaped polysilicon structures. Various array addressing schemes are disclosed.

17 Claims, 11 Drawing Sheets

U.S. PATENT DOCUMENTS

| | | |
|---|---|---|
| 7,567,457 B2 | 7/2009 | Nazarian et al. |
| 2005/0104118 A1* | 5/2005 | Diorio et al. ............... 257/315 |
| 2007/0195607 A1 | 8/2007 | Eitan et al. |
| 2008/0137408 A1 | 6/2008 | Roizin et al. |
| 2008/0290395 A1 | 11/2008 | Jeong |
| 2009/0114972 A1 | 5/2009 | Liu |
| 2009/0122603 A1* | 5/2009 | Liu et al. ............... 365/185.03 |

OTHER PUBLICATIONS

Miyamoto et al.: "An Experimental 5-V-Only 256-kbit CMOS EEPROM With A High-Performance Single-Polysilicon Cell", IEEE Journal of Solid-State Circuits, vol. sc-21, No. 5, Oct. 1986, pp. 852-860.

O'Shea et al.: "Compact Model Development For A New Non-Volatile Memory Cell Architecture", Proc. IEEE 2002 Int. Conference On Microelectronic Test Structures, vol. 15, Apr. 2002, pp. 151-156.

Mori et al.: "Thickness Scaling Limitation Factors Of ONO Interpoly Dielectric For Nonvolatile Memory Devices", IEEE Transactions On Electron Devices, vol. 43, No. 1, Jan. 1996, pp. 47-53.

Choi et al.: "High Speed Flash Memory And 1T-DRAM On Dopant Segregated Schottky Barrier (DSSB) FinFET SONOS Device For Multi-Functional SoC Applications", IEEE International 2008, Dec. 15-17, 2008, pp. 223-226.

* cited by examiner

US 7,800,156 B2

ASYMMETRIC SINGLE POLY NMOS NON-VOLATILE MEMORY CELL

FIELD OF THE INVENTION

The present invention relates to non-volatile memory (NVM) cells. More specifically, the present invention relates to NVM cell arrays that are "embedded" in (i.e., integrally formed with) complementary metal-oxide-semiconductor (CMOS) integrated circuits (ICs), and to methods for fabricating the NVM cells in an inexpensive manner using standard CMOS process flows.

BACKGROUND OF THE INVENTION

"CMOS" refers to both a particular style of digital circuitry design, and the family of processes used to implement that circuitry on IC "chips" or "die". CMOS logic uses a combination of p-type and n-type metal-oxide-semiconductor field-effect transistors (MOSFETs) to implement logic gates and other digital circuits found in computers, telecommunication equipment, and signal processing equipment. Typical commercial CMOS ICs include millions (or hundreds of millions) of n-type and p-type MOSFETS.

Most CMOS IC manufacturers (aka, "fabs") generate standardized process "flows" for generating CMOS ICs on monocrystalline silicon wafers. Each CMOS process flow includes a series of processing steps (e.g., material deposition, photolithographic exposure, and etching) that are required to produce a desired CMOS IC product. Standard CMOS process flows are typically developed to produce "normal" CMOS IC devices (i.e., CMOS IC devices that comprise mainly volatile n-type and p-type MOSFETS) using a minimum number of processing steps in order to minimize overall production costs. Significant effort is typically expended by each manufacturer to make their standard CMOS process flow as time and cost efficient as possible. Once a standard CMOS flow is optimized, it can typically be used to make a large number of CMOS IC designs by merely by providing a different set of photolithography masks for each IC design, and then repeating the standard CMOS process flow using the selected set of photolithography masks.

Although most standard CMOS process flows facilitate the inclusion of non-MOSFET circuit components into the CMOS IC products, a problem arises when a circuit design requires a circuit component that cannot be produced by the standard CMOS process flow. In this case, the CMOS process flow must be modified at great expense to include additional steps in order to produce the needed circuit component. It is therefore desirable to develop methods for producing the non-standard circuit component using the steps of the existing CMOS process flow.

Non-volatile memory (NVM) or "floating gate" cells represent one type of non-standard circuit component that is often needed in large scale CMOS ICs. In contrast to volatile (aka primary storage) memory such as typical n-type and p-type MOSFETs, which require continuous power to retain stored information, NVM cells are able to retain a stored state even when power to an IC is turned off, thereby allowing the IC to "remember" important operating conditions and information upon restart. Several types of NVM cells have been developed that can be produced with minimal changes to a standard CMOS process flow. One NVM cell that has a small floating gate capacitively coupled to the drain area is disclosed in U.S. Pat. No. 6,678,190. This NVM cell is a programmable read only memory comprising two serially connected P-type metal-oxide semiconductor (MOS) transistors.

A problem with the PMOS NVM cells of U.S. Pat. No. 6,678,190 is that the disclosed structure is impractical for performing erase operations due to the large voltage on the control gate that is needed to stimulate electron back-tunneling from or hole injection to the floating gate—even for voltages approaching the breakdown of the N-well junction, the potential difference between the floating gate and N-well is smaller than several volts. Further, the symmetric arrangement of the NVM cell of U.S. Pat. No. 6,678,190 requires a select transistor to address the cell.

Another NVM cell that also includes two PMOS transistors is described in U.S. Pat. No. 7,078,761. The floating gate includes an extension acting as a control gate and located over a special N-well that is spaced from the source and drain of the NVM transistor. A problem with this arrangement is that, along with the two-PMOS arrangement, the special N-well requires additional space, thus making the overall cell size undesirably large. The NVM cell of U.S. Pat. No. 7,078,761 also has a problem similar to that of the NVM cell of U.S. Pat. No. 6,678,190 in that it requires a select transistor to address the cell.

What is needed is an NVM cell that is small to medium in size, can be produced using a standard CMOS process flow having a single polysilicon layer, and exhibits high endurance.

SUMMARY OF THE INVENTION

[FIGS. 1 and 2] The present invention is directed to medium-sized, asymmetric NVM (logic) cells that are produced using standard single-poly CMOS process flows and exhibit high endurance. Each NVM cell is asymmetric in that it includes a floating gate that has a first portion disposed over a channel region and a second (extension) portion that overlaps (i.e., extends "over") an enlarged drain (diffusion) region at a location away from the channel region, thereby providing a gate-to-drain capacitance that is higher than the gate-to-source capacitance. This asymmetric arrangement facilitates desirable hot electron programming of the floating gate by applying a positive programming voltage to the drain region and coupling the source region to ground, thereby causing channel hot electron (CHE) injection from the drain region into both portions of the floating gate. In one embodiment, the programming process is enhanced by applying a bias to the channel region. By programming in this way, the need for separate control gate diffusions may be avoided, thus minimizing the size of the asymmetric NVM cell. Erasing the floating gate involves coupling the drain diffusion to ground and applying the positive voltage to the source, thereby causing Band-to-Band Tunneling (BBT) generation of holes and their injection into the floating gate. Tests performed on asymmetric NVM cells produced in accordance with the present invention exhibit superior endurance (over several hundred programming cycles). Accordingly, asymmetric NVM cells produced in accordance with the present invention are ideal for incorporating into low cost CMOS integrated circuits (ICs) that require high endurance, high density (i.e., several Kbits to 1 Mbit) NVM cells.

According to an embodiment of the invention, a CMOS IC includes both high voltage (HV) MOSFETs and low voltage (LV) MOSFETs and at least one asymmetric NVM cell formed on a substrate using a standard CMOS process flow. The HV MOSFET and the LV MOSFET are fabricated using processing steps that are optimized for producing these different devices. For example, HV MOSFETs are produced using lower density LDD (HV-LDD) implants, thicker gate oxides (HV-OX) and wider polysilicon gate lines that are optimized for the higher (e.g., 5V) applied voltages expected on HV MOSFETs during operation. In contrast, LV MOSFETs are produced using higher density LDD (LV-LDD) implants, thinner gate oxides (LV-OX) and narrower polysilicon gate lines that are optimized for the lower (e.g., 1V) applied voltages expected on LV MOSFETs during operation. The various process steps used to fabricate HV and LV MOSFETs are included in standard CMOS process flows. In accordance with an aspect of the invention, these various HV and LV process steps are utilized to optimize the asymmetric NVM cells by using the LV gate design rules (LV DR) to define the width of the extension portion of the floating gate, and utilizing one or more of the LDD implants to form a continuous implant region that merges (i.e., extends entirely across) the N+ drain diffusion under the extension portion. The present inventors have found that superior asymmetric NVM cells are produced by forming the floating gate on the thicker HV gate oxide, utilizing the LV-LDD processing step in the source/drain/channel region of the NVM cells, and generating the implant region under the extension portion using the both LV-LDD and HV-LDD processing steps.

In accordance with another aspect of the present invention, various drain region and floating gate configurations are used to optimize cell function and minimize cell size. In one embodiment, the first (channel) and second (extension) portions of the floating gate form two sides of a J- or U-shaped polysilicon structure that is connected by a third portion extending therebetween. In another embodiment, the floating gate is formed in a digitated manner such that two extension portions extend from opposite ends of the first (channel) portion into the drain region. Optional select transistors are included in each NVM cell to provide selective access to the drain region for purposes of supporting E2 operations, and for guarding again possible large array effects. In yet another embodiment, an NVM cell without select transistor is provided with a minimal cell size using a contact disposed inside the U-shaped floating gate for increasing of capacitive coupling of drain to the floating gate.

In accordance with another aspect of the present invention, the asymmetric NVM cells are arranged in arrays that facilitate cell operations while minimizing occupied chip space. In one embodiment, each NVM cell is connected between one bit line and one word line, and program/erase operations are performed by applying programming voltages to one word line and one bit line at a time. In another embodiment, alternative schemes are utilized in conjunction with NVM cells having select transistors that include two word lines or two bit lines per cell, which provides an additional immunity to over-erase, that can be important for NVM cells cycled a large number of times. In yet another embodiment, the source regions of adjacent pairs of NVM cells are connected to a common word line in order to decrease the size of the select transistors and thus save area.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in embedded CMOS NVM cells. The following description is presented to enable one of ordinary skill in the art to make and use the invention as provided in the context of a particular application and its requirements. The terms "coupled" and "connected", when used alone herein, are defined as follows. The term "connected" is used to describe a direct connection between two circuit elements or structures, for example, by way of a conducting diffusion or metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). In contrast to "coupled" (alone), the phrases "capacitive coupling" and "capacitively coupled" indicates the transfer of energy by means of the capacitance between two nodes or circuit structures. In addition, the term "region" is defined herein to describe a volumetric (three-dimensional) area having substantially identical electrical properties and/or doping concentrations. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
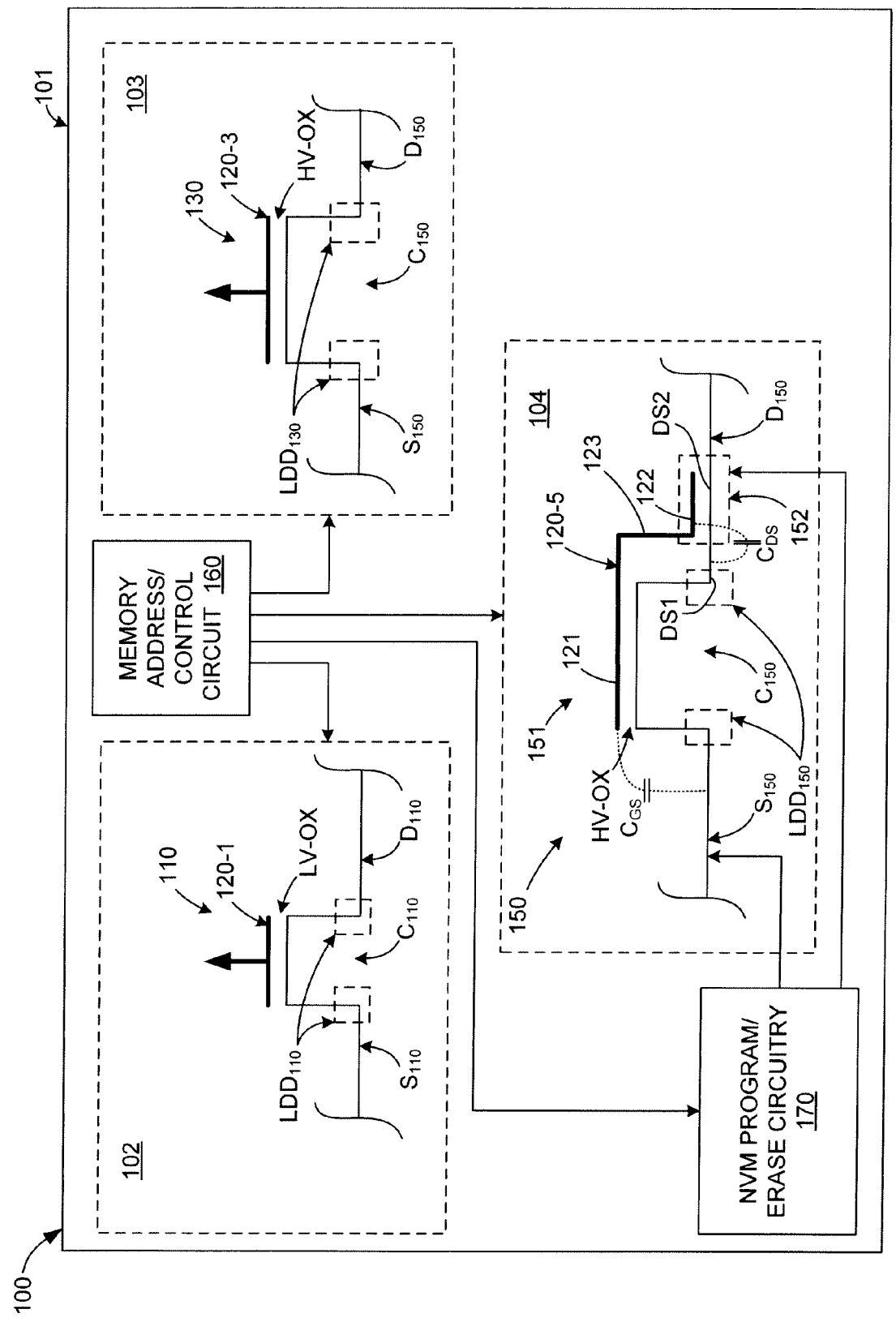
FIG. 1 is a simplified circuit diagram showing a CMOS IC including LV and HV MOSFETs and an asymmetric NMOS NVM cell according to an embodiment of the present invention.

FIG. 1 is a simplified circuit diagram showing a CMOS IC 100 including an LV MOSFET 110, an HV MOSFET 130, and an asymmetric NMOS NVM cell 150 according to an embodiment of the present invention. CMOS IC 100 is fabricated on a monocrystalline silicon "chip" 101 by a standardized CMOS process, and includes a large number of each memory cell type, as well as other circuit components that are omitted for brevity. LV MOSFET 110 is typically utilized to perform logic functions, and is therefore located in a central area 102 of chip 101 and designed and fabricated for low internal (device) operating voltages (e.g., 1V) in order to minimize cell size and power consumption. In contrast, HV MOSFET 130 is typically utilized to perform voltage conversion and other interface functions, and is therefore designed and fabricated for high external (system) operating voltages (e.g., 5V), and are typically located on exterior peripheral areas 103 of chip 101. NVM cell 150 is located in an area 104 that is located either in internal area 102, external area 103 or both, and serves to store control and/or data bits that is needed after power down.

Referring to the top left portion of FIG. 1, as is well known in the art, NMOS LV MOSFET 110 includes an N+ source region $S_{110}$ and an N+ drain region $D_{110}$ separated by a p-type channel region $C_{110}$. Formed over channel region $C_{110}$ is a polysilicon gate structure 120-1 that is separated from an upper surface of substrate 101 by a low-voltage gate oxide layer LV-OX. NMOS LV MOSFET 110 also includes low voltage n-type LDD regions $LDD_{110}$ having a first (relatively high) doping concentration that are connected to each of source region $S_{110}$ and drain region $D_{110}$ and extend into channel region $C_{110}$.

Referring to the top right portion of FIG. 1, as is also well known in the art, NMOS HV MOSFET 130 includes an N+ source region $S_{130}$ and an N+ drain region $D_{130}$ separated by a p-type channel region $C_{130}$. Formed over channel region $C_{130}$ is a polysilicon gate structure 120-3 that is separated from an upper surface of substrate 101 by a high-voltage gate oxide layer HV-OX. Note that high-voltage gate oxide layer HV-OX is typically thicker than low-voltage oxide layer LV-OX of LV MOSFET 110. NMOS HV MOSFET 130 also includes high-voltage n-type LDD regions $LDD_{130}$ having a second, relatively low doping concentration (i.e., lower than the doping concentration $LDD_{110}$ of LV MOSFET 110) that are connected to each of source region $S_{130}$ and drain region $D_{130}$ and extend into channel region $C_{130}$.

Referring to the lower portion of FIG. 1, asymmetric NVM cell 150 includes a floating gate NMOS transistor 151 having a source region $S_{150}$ and a drain region $D_{150}$ diffused into substrate 101 and separated by a p-type channel region $C_{150}$, and a polysilicon floating gate 120-5 that is at least partially disposed over channel region $C_{150}$, and also includes at least one additional portion formed over drain region $D_{150}$ such that a gate-drain capacitance $C_{DS}$ between floating gate 120-5 and drain region $D_{150}$ is substantially (i.e., at least 4 times) higher than a gate-source capacitance $C_{GS}$ between floating gate 120-5 and source region $S_{150}$. In particular, as indicated in FIG. 1, floating gate 120-5 includes a first portion 121 disposed over channel region $C_{150}$ (i.e., such that first portion 121 is disposed adjacent to a first section DS1 of drain region $D_{150}$, and a second portion 123 extending over a second section DS2 of drain region $D_{150}$, wherein second section DS2 is spaced from first section DS1. As described in the various specific embodiments below, floating gate 120-5 is an integral polysilicon structure that is etched from a single polysilicon layer (e.g., using a single photolithographic mask and etching step) such that first portion 121 is connected to second portion 123 either directly (i.e., second portion 123 is connected to and extends from first portion 121) or connected by an optional intermediate (third) portion 125, as shown in FIG. 1. As such, floating gate 120-5 is formed such that when floating gate 120-5 is programmed, both first portion 121 and second portion 123 have the same program voltage (e.g., 4V), and when floating gate 120-5 is erased, both first portion 121 and second portion 123 have the same erase voltage (below ~0.5V). Referring to the bottom portion of NVM cell 150, in accordance with an aspect of the present invention, NVM cell 150 also includes LDD region $LDD_{150}$ that are connected to each of source region $S_{150}$ and drain region $D_{150}$ and extend into channel region $C_{150}$, and also includes a second implant region 152 under second section DS2 of drain region $D_{150}$. The purpose and function of second implant region 152 is described in detail below.

Referring again to FIG. 1, in addition to the above-described transistor types, CMOS IC 100 includes a memory address/control circuit 160 and NVM program/erase circuitry 170 that are utilized in the manner described below to access LV MOSFET 110 and HV MOSFET 130, and used for programming floating gate 120-5 of NVM cell 150 by transferring a positive programming potential from drain region $D_{150}$ to floating gate 120-5, and for erasing floating gate 120-5 by transferring an approximately zero volt potential from the drain region $D_{150}$ to the floating gate 120-5.

Figure 2:
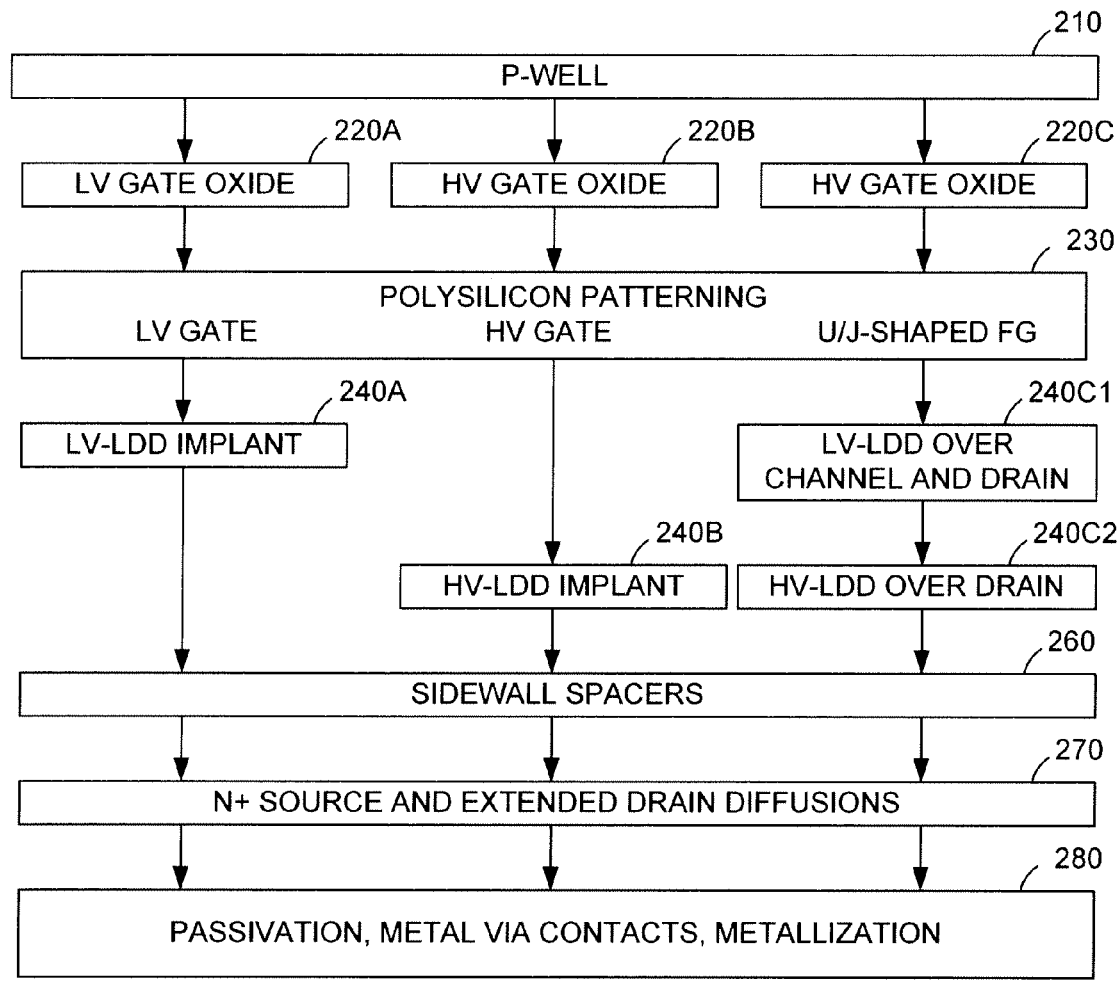
FIG. 2 is a flow diagram depicting a standard CMOS flow utilized to produce CMOS circuit of FIG. 1 according to another embodiment of the present invention.

CMOS 100 is produced using a standardized CMOS process flow that is depicted in relevant part in FIG. 2. Fabrications steps that are not essential to describe the present invention, such as those utilized to produce p-type MOSFETs, are omitted for brevity. The CMOS process flow includes a process of forming P-well regions in substrate 101 (block 210) that define the boundaries of LV MOSFET 110, HV MOSFET 130 and NMOS cell 150. Referring to the left and central portions of FIG. 2, gate oxide layers are then formed on the upper surface of substrate 101 using separated processing steps. This gate oxide layer production includes forming a relatively thin gate oxide LV-OX (e.g., 30 Angstroms); step 220A) for LV MOSFET 110 and a relatively thick gate oxide HS-OX (e.g., 70 Angstroms; step 220B) for HV MOSFET 130. Next, a single polysilicon layer having a thickness of approximately 2000 Angstroms is formed and patterned using known techniques (block 230). Note that LV gate structure 120-1 of LV MOSFET 110 has a first (relatively narrow) gate line width (e.g., 0.14 μm (microns)) that is defined by the design rules (DR) of the standard CMOS process flow. In contrast, that HV gate structure 120-3 of HV MOSFET 130 has a second (relatively wide) gate line width (e.g., 0.35 μm) that is selected to facilitate high voltage operation. Following the polysilicon etch process, two separate LDD implants are performed using two masks and implant processes. LDD implants consist of combinations of donor and acceptor (pocket) implants with the dominance of donor implants for both LV and HV NMOS transistors. In particular, an LV-LDD implant (block 240A) is performed using a first mask to provide LDD regions $LDD_{110}$ of LV MOSFET 110, and an HV-LDD implant (block 240B) is performed using a second mask to provide LDD regions $LDD_{130}$ of HV MOSFET 130. Following the LV LDD and the HV LDD implant processes, sidewall spacers are formed on the polysilicon structures (block 260), and N+ source/drain region diffusions (block 270) are formed in accordance with known techniques. Finally, first pre-metal dielectric, contacts, metallization, including interlayer dielectrics and metal Vias, and passivation are performed according to known techniques.

Referring to the right side of FIG. 2, in accordance with an aspect of the present invention, NVM cell 150 (FIG. 1) is entirely fabricated utilizing the existing LV and HV process steps of the standard CMOS process flow that are utilized to form LV MOSFET 110 and HV MOSFET 130. In particular, NVM cell 150 is produced using only the process steps of a standard CMOS process flow (i.e., no extra masks are required), which in turn facilitate the incorporation of NVM cell 150 into CMOS ICs without any additional manufacturing costs. As indicated on the right side of FIG. 2, source region $S_{150}$ and drain region $D_{150}$ of NVM cell 150 are formed using the same p-well process step (block 210) as that used to form LV MOSFET 110 and HV MOSFET 130. Next, NVM cell 150 is produced using the same gate oxide HV-OX step (block 220C) that is used to form HV MOSFET 130. The single polysilicon layer used to form gates 120-1 and 120-3 is also patterned to form NVM cell 150 (step 230), with modifications to the floating gate shape being incorporated into the poly mask that are described in detail below. In accordance with an aspect of the present invention, NVM cell is then subjected to two LDD implant steps (blocks 240C1 and 240C2), with the LV LDD implant step utilized for LV MOSFET 110 being used to form LDD regions $LDD_{150}$ (i.e., adjacent channel $C_{150}$; see FIG. 1) and to provide a first implant dose to second diffusion region 152 (block 240C1), and the HV-LDD implant step utilized to for HV MOSFET 130 being used to provide a second implant dose to second diffusion region 152 (see FIG. 1; block 240C2). As set forth below, by forming NVM cell 150 using the thicker HV gate oxide and utilizing both the LV-LDD and HV-LDD implant processes in the manner described above, the present invention facilitates forming an implant region that extends entirely under the second portion 123 of floating gate 120-5, whereby an optimal high drain field is provided that facilitates CHE programming. Following the LDD implants, floating gate 120-5 is subject to the same sidewall spacer process (block 260), N+ source/drain diffusion process (block 270) and same passivation, metal via, and metallization processes (block 280) that are utilized in the fabrication of LV MOSFET 110 an HV MOSFET 130.

Figure 3:
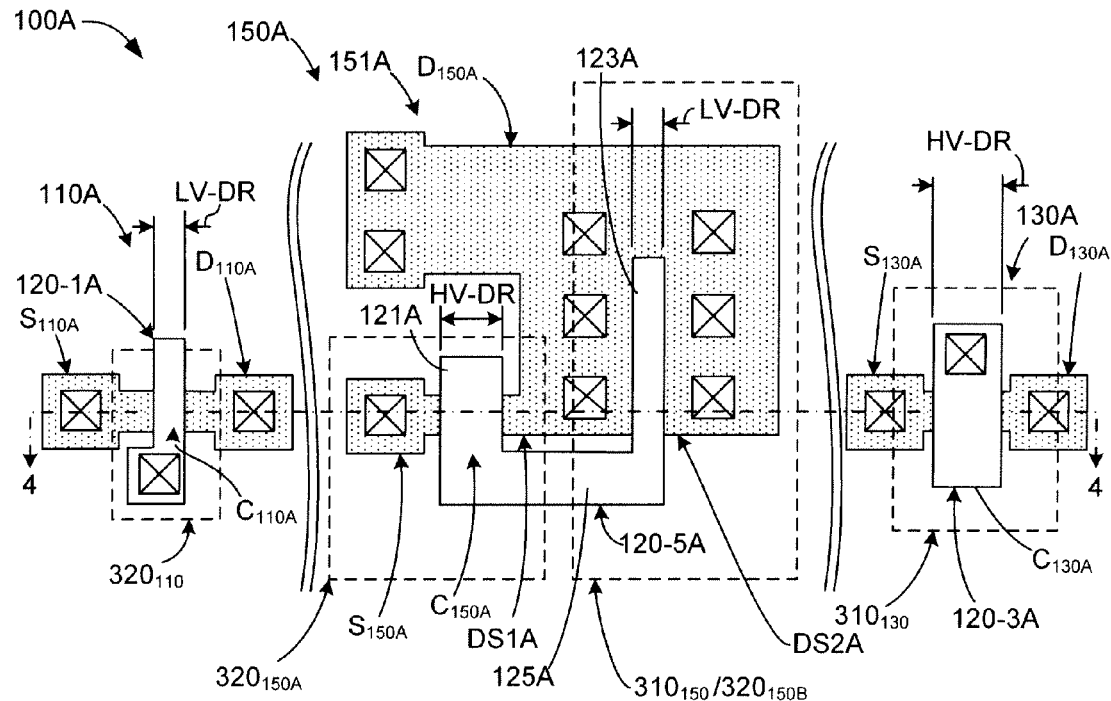
FIG. 3 is simplified top plan (layout) view showing portions of a CMOS IC including an asymmetric NMOS NVM cell according to a specific embodiment of the present invention.
Figure 4:
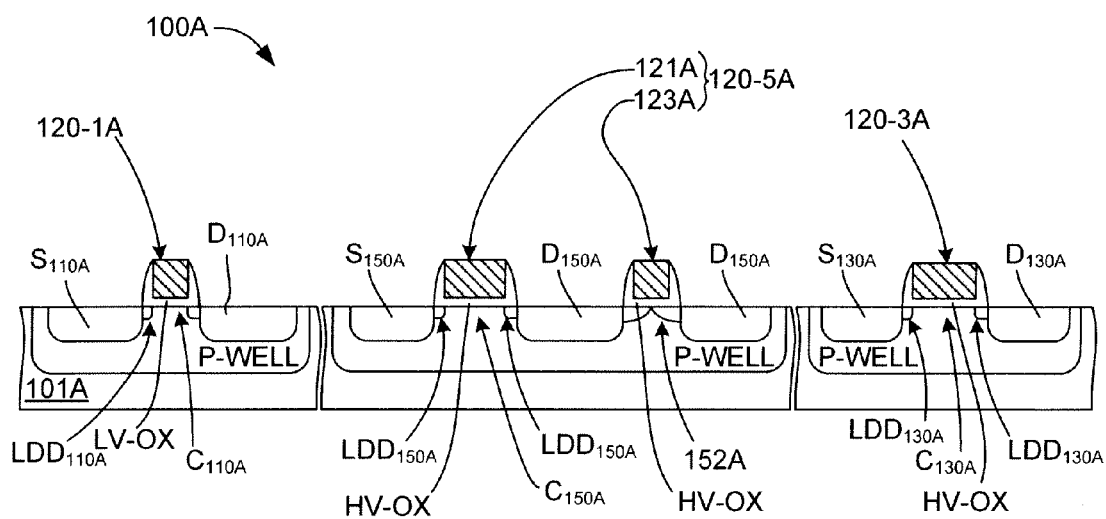
FIG. 4 is a cross-sectional side view showing the CMOS IC taken along section line 4-4 of FIG. 3.

FIGS. 3 and 4 are simplified plan and cross-sectional views showing an exemplary CMOS IC 100A fabricated on substrate 101A in accordance with a specific embodiment of the present invention. CMOS IC 100A including an LV MOSFET 110A, an HV MOSFET 130A, and an asymmetric NMOS NVM cell 150A. Referring to the left side of FIGS. 3 and 4, LV MOSFET 110A includes an N+ source region $S_{110A}$ and an N+ drain region $D_{110A}$ separated by a p-type channel region $C_{110A}$, a polysilicon gate structure 120-1A formed on LV gate oxide layer LV-OX, and includes n-type LDD regions $LDD_{110A}$ that are connected to each of source region $S_{110A}$ and drain region $D_{110A}$ and extend into channel region $C_{110A}$. Referring to the right side of FIGS. 3 and 4, HV MOSFET 130A includes an N+ source region $S_{130A}$ and an N+ drain region $D_{130A}$ separated by a p-type channel region $C_{130A}$, a polysilicon gate structure 120-3A formed on HV gate oxide layer HV-OX, and includes n-type LDD regions $LDD_{130A}$. Referring to the central portions of FIGS. 3 and 4, asymmetric NVM cell 150A includes a floating gate NMOS transistor 151A having a source region $S_{150A}$ and an enlarged drain region $D_{150A}$ separated by a channel region $C_{150A}$, and a polysilicon floating gate 120-5A that is formed on a gate oxide HV-OX. Referring to FIG. 4, NVM cell 150 also includes LDD regions $LDD_{150A}$ (formed using the LV-LDD implant) that are connected to each of source region $S_{150A}$ and drain region $D_{150A}$. In FIG. 3, the square boxes with internal "X" shapes designated contact structures uses to provide electrical connection to the source/drain and gate structures of CMOS IC 100A.

In accordance with an aspect of the present embodiment, floating gate 120-5A comprises a substantially U- or J-shaped structure (herein collectively referred to as "U-shaped" for brevity) including a first portion 121A disposed over channel region $C_{150A}$, a second portion 123A extending parallel to first portion 121A and extending over a central area of enlarged drain region $D_{150A}$, and a third (intermediate) portion 125A that is connected between respective ends of first portion 121A and second portion 123A, and is disposed over an area located outside of the boundaries of channel region $C_{150A}$ and drain region $D_{150A}$. First portion 121A has a gate line width defined by the high voltage design rule (HV-DR) of the standardized CMOS process flow (i.e., first portion 121A has the same width as gate 120-3A of HV MOSFET 130A). Second portion 123A has a width defined by the minimum low voltage design rule (LV-DR) of the standardized CMOS process flow. The relatively wide width of first portion 121A is required to support the relatively high voltage potentials that are generated between source region $S_{150A}$, and drain region $D_{150A}$ (across channel region $C_{150A}$) without breakdown. In contrast, second and third portions 123A and 125A are not subject to the operating constraints and potentials of first portion 121A, and therefore are made narrower than first portion 121A in order to save space and decrease parasitic capacitance to Vss.

In accordance with another aspect of the present embodiment, NVM cell 150 includes both LV-LDD and HV-LDD implants during the respective LV-LDD and HV-LDD implant process steps. That is, as indicated in FIG. 3, the mask use during the HV-LDD process defines a first opening $310_{130}$ that is positioned over the source/drain/channel regions of HV MOSFET 130, and a second opening $310_{150}$ that is positioned over second section DS2A of floating gate cell 151A. Similarly, the mask use during the LV-LDD process defines a first opening $320_{110}$ that is positioned over the source/drain/channel regions of LV MOSFET 110, and second and third openings $320_{150A}$ and $320_{150B}$ that are positioned over sections DS1A and DS2A, correspondingly. As shown in FIG. 4, during the HV-LDD implant process, the mask openings $310_{130}$ and $310_{150}$ respectively produce HV-LDD implant regions $HV-LDD_{130A}$ under gate 120-3A, and an HV LDD implant under gate 123A (i.e., in region 152A). In addition, during the LV-LDD implant process, the mask openings $320_{110}$, $320_{150A}$ and $320_{150B}$ produce LV-LDD implant regions LV-LDD$_{110A}$ under gate 120-1A, a LV-LDD implant in region 152A under second portion 123A, and implant region LDD$_{150A}$ under gate portion 121A of floating gate 120-5A. As such, implanted region 152A has the sum of both HV-LDD and LV-LDD doping concentrations of LDD regions LDD$_{110A}$ and LDD$_{130A}$, shown in FIG. 4. The present inventors have found that superior asymmetric NVM cells are produced by forming floating gate 120-5 on the relatively thick HV gate oxide such that second portion 123A has the minimal width set by the LV-DR, using LV-LDD implants in the source/drain/channel region below first portion 121A, and generating implant region 152A under second portion 123A using both the LV-LDD and HV-LDD implants. This combination of processes are believed to form implant region 152A such that it merges under (i.e., extends entirely under) second portion 123A, as depicted in FIG. 4, whereby implant region 152A extends between opposing edges of N+ drain region D$_{150A}$ that are located below opposing side edges of second portion 123A.

In accordance with another aspect of the present embodiment, NVM cell 150A is programmed using channel hot electron (CHE) injection and erased using band-to-band tunneling (BBT). During programming, a positive programming voltage (e.g., 4.5V) is applied to drain region D$_{150A}$ and source region S$_{150A}$ is connected to ground (0V), thereby causing CHE injection from drain region D$_{150}$ into the floating gate 120-5A. In one embodiment, the programming process is enhanced by applying a body bias voltage (e.g., −3V to the P-well in which transistor 151 is formed). In one specific embodiment, the body bias from −3V to −5V voltage is applied to the isolated P-well containing channel region C$_{150A}$ with a delay period of 1 to 100 μS (100 microseconds) before asserting the programming voltages 4.5V to drain region D$_{150A}$ and 0V to source region S$_{150A}$. In yet another alternative embodiment, the all programming voltages (i.e., applied to drain region D$_{150A}$ and source region S$_{150A}$) are positive with respect to bulk, which is maintained at Vss=0V (e.g., Vss=0; V$_{S150A}$=4V, and V$_{D150A}$=8V). In this embodiment, the programming voltage is first applied to the source and then (with a lag of 1-100 μs) to the drain (the lag is needed to exclude large voltage built up at the gate oxide under first portion 121A. By programming NVM cell 150A using one of these techniques, the need for separate control gate diffusions may be avoided, thus minimizing the size of asymmetric NVM cell 150A. Erase operations are performed by connecting drain region D$_{150A}$ to ground and applying the positive programming voltage to source region S$_{150A}$, thereby causing BBT generation of holes in the region S$_{150A}$, their acceleration in the field of source junction and tunneling into the floating gate 120-5.

Figure 5:
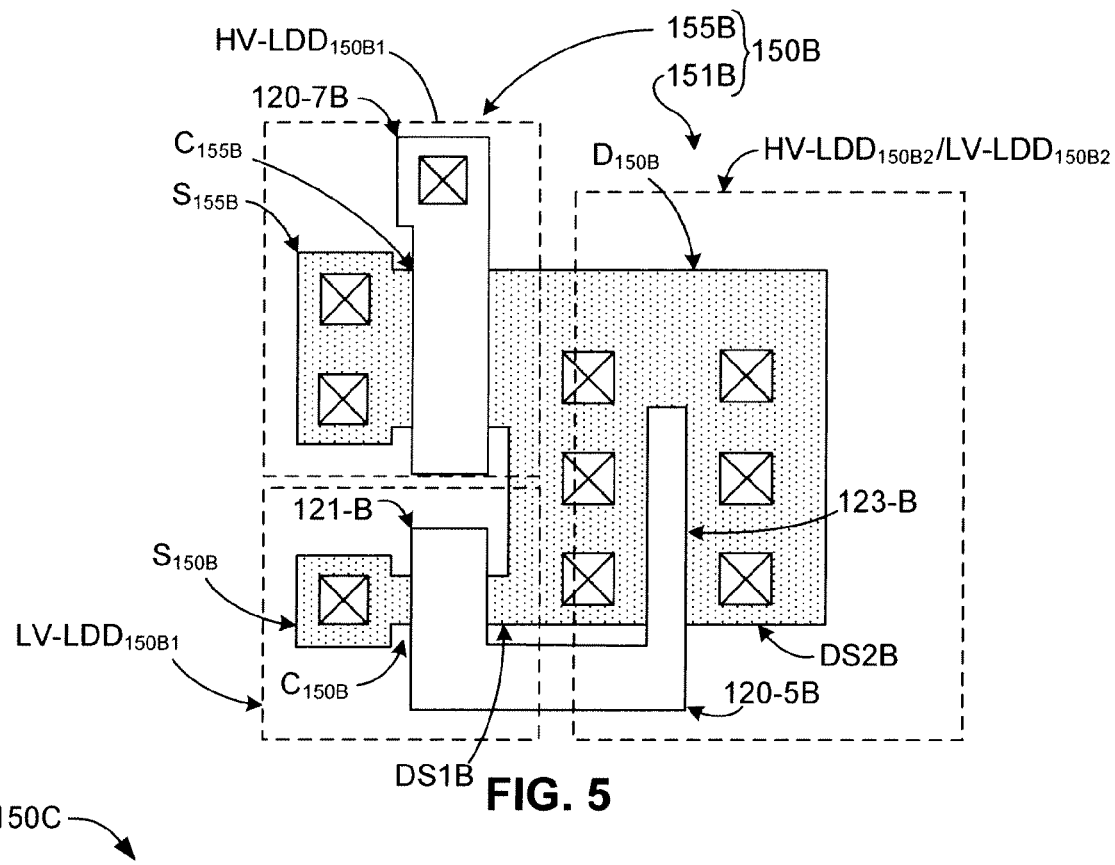
FIG. 5 is simplified top plan (layout) view showing an asymmetric NMOS NVM cell according to another specific embodiment of the present invention.

FIG. 5 is simplified top plan view showing an asymmetric NMOS NVM cell 150B according to another specific embodiment of the present invention. NVM cell 150B is formed as part of a CMOS IC, similar to that described above, which includes both LV MOSFETs and HV MOSFETs, which are omitted from the discussion below for brevity. Similar to NVM cell 150A (discussed above), NVM cell 150B includes a floating gate NMOS transistor 151B having a source region S$_{150B}$ and an enlarged drain region D$_{150B}$ separated by a channel region C$_{150B}$, and a polysilicon floating gate 120-5B. Floating gate 120-5B is essentially identical to floating gate 120-5A (discussed above) in that it is formed on an HV oxide (not shown), and includes a first portion 121B disposed over channel region C$_{150B}$ and adjacent to a first section DS1B of drain region D$_{150B}$, a second portion 123B disposed over second section DS2B of drain region D$_{150B}$.

Floating gate NMOS transistor 151B is subjected to the LDD implant processes in the manner described above such that a windows LV-LDD$_{150B1}$ and LV-LDD$_{150B2}$ facilitate LV-LDD implant regions disposed under first portion 121B of floating gate 120-5B and under second portion 123B of floating gate 120-5B, and a window HV-LDD$_{150B2}$ facilitates the HV-LDD implant under second portion 123B of floating gate 120-5B (i.e., region DS2B includes both LV-LDD and HV-LDD implants).

In accordance with an aspect of the present embodiment, NVM cell 150B further includes a select transistor 155B formed by a separate source region S$_{155B}$, a channel region C$_{155B}$ disposed between source region S$_{155B}$ and a third portion DS3B of drain region D$_{150B}$, and a polysilicon gate structure 120-7B that is disposed over channel region C$_{155B}$. Select transistor includes HV-LDD implants that are formed through window HV-LDD$_{150B1}$, which is defined in the same mask as that of window HV-LDD$_{150B2}$, mentioned above. Although the provision of select transistor 155B increases the size of NVM cell 150B over that of NVM cell 150A (described above), select transistor 155B provides advantages in some instances over the embodiments disclosed herein that do not include select transistors. In principal, there is no need for a select transistor in the proposed NVM cells because the proposed NVM memory cells are asymmetric. That is, each proposed NVM cell (e.g., NVM cell 150A) is read-out in one direction only, similar to cross-wise memories where the memory element is a switching resistor connected in series diode. The select transistor (e.g., transistor 155B) is provided for two reasons. First, the select transistor is provided to cover special array architectures, e.g., to allow EEPROM (sometimes called "E$^2$") mode of operation wherein programming/erase of a single bit is possible. In the embodiments of present patent that do not include select transistors, erase operations are "flash" type operations wherein a whole block (or row/column) is erased. Second, the select transistor is provided to account for possible array effects that can appear in the qualification of large arrays (program and read disturbs, overerase, etc.). At the time of filing, the inventors tested only small-sized arrays without select transistors and disturb effects were not revealed.

Figure 6:
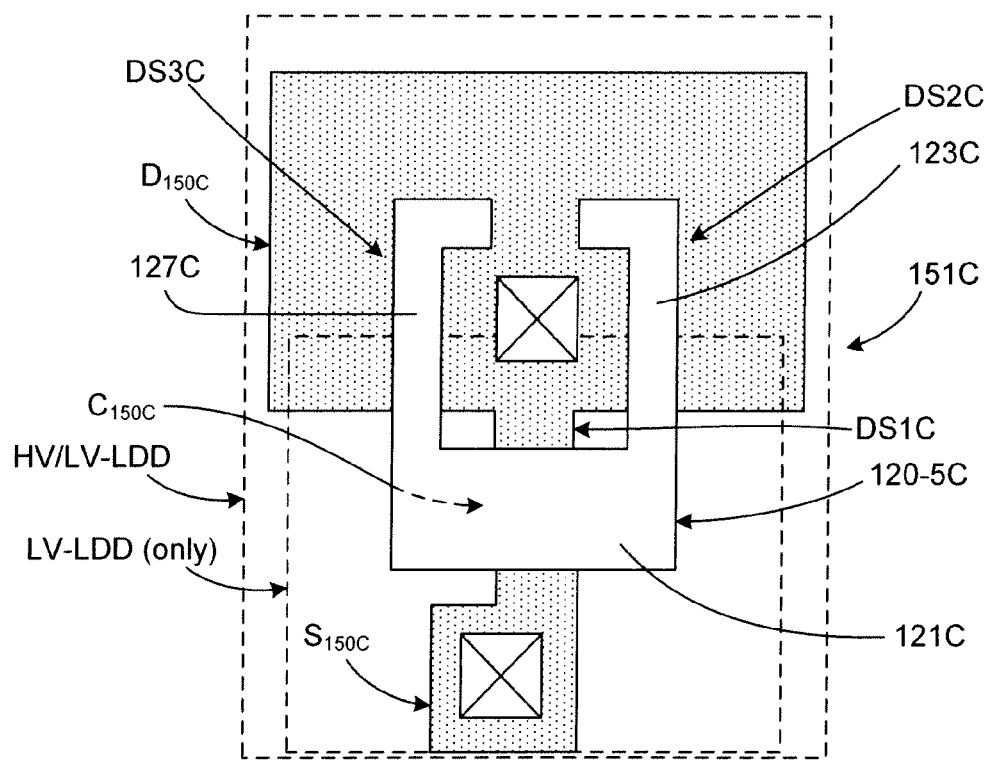
FIG. 6 is simplified top plan (layout) view showing an asymmetric NMOS NVM cell according to yet another specific embodiment of the present invention.

FIG. 6 is simplified top plan view showing an asymmetric NMOS NVM cell 150C according to another specific embodiment of the present invention. Similar to NVM cell 150A (discussed above), NVM cell 150C includes a floating gate NMOS transistor 151C having a source region S$_{150C}$ and an enlarged drain region D$_{150C}$ separated by a channel region C$_{150C}$, and a polysilicon floating gate 120-5C formed on an HV oxide (not shown). However in this embodiment, enlarged drain region D$_{150C}$ is shaped such that it extends to both sides of channel region C$_{150C}$, and floating gate 120-5C includes a digitated structure including an elongated first portion 121C disposed over channel region C$_{150C}$ and adjacent to a first section DS1C of drain region D$_{150C}$, an elongated second portion 123C extending from a first (right) end of first portion 121C over a second section DS2C of drain region D$_{150B}$, and an elongated third portion 127C extending from a second (left) end of first portion 121C over a third section DS3C of drain region D$_{150B}$. Floating gate 120-5C is patterned such that first portion 121C has a width determined by the HV-DR, and second and third portions 123C and 127C have widths determined by the LV-DR for the reasons set forth above with reference to NVM cell 150A. Floating gate NMOS transistor 151C is subjected to the LDD implant processes in the manner described above such that a window HV-LDD$_{150C}$ facilitates the blocking of HV-LDD regions disposed under first portion 121C of floating gate 120-5C, and a window LV-LDD$_{150C}$ facilitates the formation of a merged implant region under second portion 123C of floating gate 120-5C and serves to form the LV LDD implant in the region of region 121C. The benefit of the geometry cell 150C is minimum cell area combined with simultaneously high coupling of the drain diffusion over the floating gate.

Figure 7:
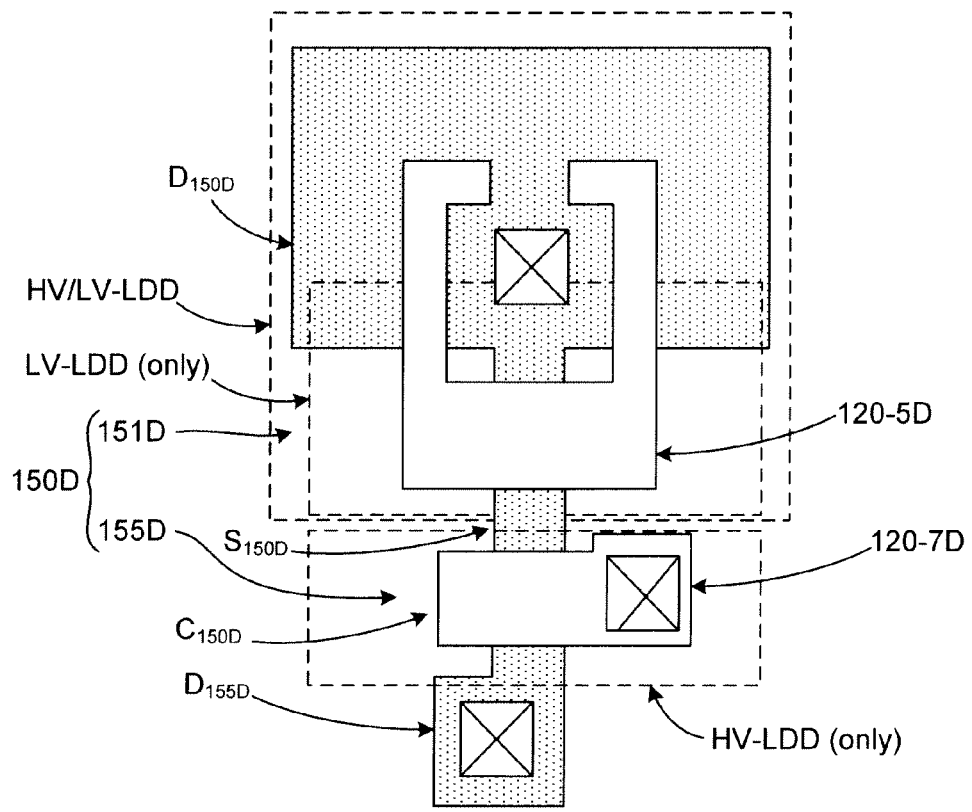
FIG. 7 is simplified top plan (layout) view showing an asymmetric NMOS NVM cell according to yet another specific embodiment of the present invention.

FIG. 7 is simplified top plan view showing an asymmetric NMOS NVM cell 150D according to yet another specific embodiment of the present invention. NVM cell 150D is substantially identical to NVM cell 150C (discussed above) in that NVM cell 150D includes a floating gate NMOS transistor 151D having a source region S$_{150D}$, an enlarged drain region D$_{150D}$, and a digitated floating gate 120-5C. However, in addition to floating gate NMOS transistor 151D, NVM cell 150D also includes a select transistor 155D formed by a separate source region D$_{155D}$, that is separated from source region S$_{150D}$ by a channel region C$_{155D}$, and a polysilicon gate structure 120-7D that is disposed over channel region C$_{155D}$. Although the provision of select transistor 155D increases the size of NVM cell 150D over that of NVM cell 150C (described above), select transistor 155D provides selective access to the source region S$_{150D}$ to provide the advantages set forth above.

Figure 8:
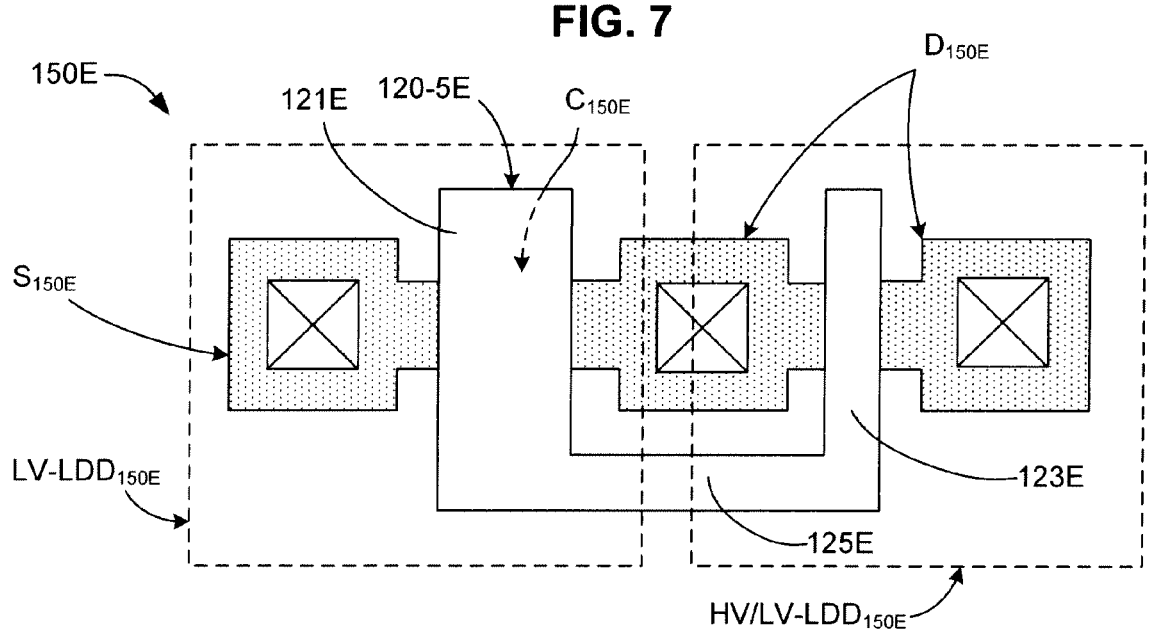
FIG. 8 is simplified top plan (layout) view showing an asymmetric NMOS NVM cell according to yet another specific embodiment of the present invention.

FIG. 8 is simplified top plan (layout) view showing an asymmetric NMOS NVM cell 150E according to yet another specific embodiment of the present invention. Similar to NVM cell 150A (discussed above), NVM cell 150E includes a source region S$_{150E}$ and an elongated drain region D$_{150E}$ separated by a channel region C$_{150E}$, and a U-shaped polysilicon floating gate 120-5E formed on an HV oxide (not shown). However in this embodiment, the size of drain region D$_{150E}$ and floating gate 120-5E are minimized to provide for a minimum cell size. An additional mask is used, and the area under second portion 123E is implanted with N+ dopant using an additional N+ implant process. The additional N+ implant merges with source/drain N+ implant (additional N+ implant is performed before polysilicon formation, and source/drain implants are performed after polysilicon formation). The additional N+ implant allows the width of second portion 123E to be larger in comparison with previous embodiments (e.g., second portion 123E can have a width similar to first portion 121E or wider). Floating gate 120-5E is patterned such that first portion 121E has a width determined by the HV-DR, and second portion 123E has a width determined by criterions of high coupling. NVM cell 150E is subjected to the LDD implant processes in the manner described above such that a window HV-LDD$_{150E}$ facilitates the blocking of HV-LDD regions and implanting of LV LDD.

FIGS. 9-12 are simplified circuit diagrams showing various arrays of asymmetric NMOS NVM cells, which are constructed in the manner described above with reference to the specific embodiments of FIGS. 3-8, as arranged and connected to associated addressing schemes. These addressing schemes facilitate cell operations while minimizing occupied chip space, and are optimized in the manner described below to facilitate programming and erasing operations.

Figure 9:
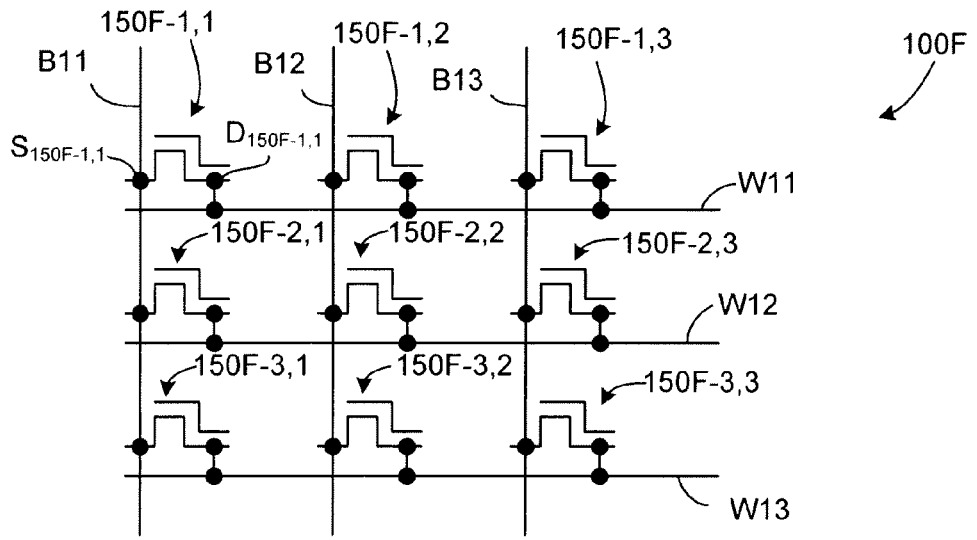
FIG. 9 is a simplified circuit diagram showing an array of asymmetric NMOS NVM cells connected to an addressing scheme according to a specific embodiment of the present invention.

FIG. 9 is a simplified circuit diagram showing a portion of a CMOS IC 100F including asymmetric NMOS NVM cells 150F-x,y arranged in an array including three rows and three columns, where "x,y" represents the row number and column number, respectively. The array includes word lines W11 to W13 and bit lines B11 to B13 that are connected to associated NVM cells 150F-x,y, and are also connected to addressing/control circuitry (e.g., circuits 160 and 170; see FIG. 1) in order to perform program/erase and read operations on the NVM cells. Word line W11 to W13 is disposed parallel to the rows of asymmetric NVM cells, and each word line is connected to the drain region of each NVM cell of an associated row. For example, word line W11 is connected to drain region D$_{150F-1,1}$ of NVM cell 150F-1,1, and also to the drain regions of NVM cells 150F-1,2 and 150F-1,3. Similarly, bit lines B11 to B13 disposed parallel to the columns of NVM cells, and each bit line is connected to the source region of each NVM cell of an associated column. For example, bit line B11 is connected to source region S$_{150F-1,1}$ of NVM cell 150F1,1, and also to the source regions of NVM cells 150F-2,1 and 150F-3,1. With this arrangement, the program/erase/read circuitry (not shown) addresses a selected NVM cell (e.g., NVM cell 150-1,1) by selectively applying predetermined programming voltages to the word line (e.g., W11) and the bit line (e.g., B11) that is associated with the selected NVM cell. Note that the remaining word lines and bit lines are disconnected (floating) during the program/erase and read operations directed to the selected NVM cell.

Figures 10A, 10B:
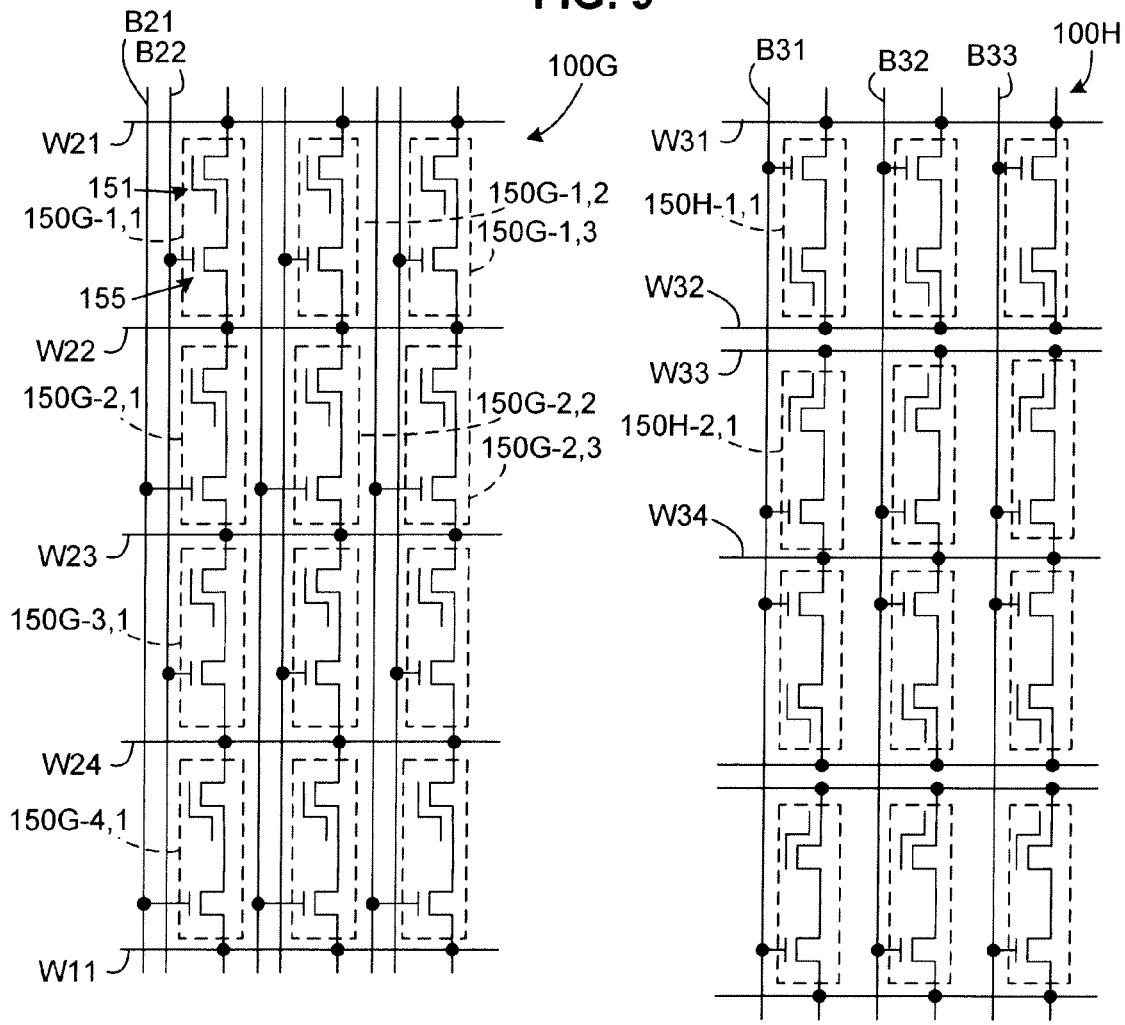
FIGS. 10(A) and 10(B) are simplified circuit diagrams showing arrays of asymmetric NMOS NVM cells connected to addressing schemes according to another specific embodiment of the present invention.

FIGS. 10(A) and 10(B) are alternative embodiments including portions of IC circuits 100G and 100H, respectively, wherein each NVM cell (e.g., NVM cell 150G-1,1) includes both a floating gate transistor 151G and a select transistor 155G. NVM cell 150G-1,1 is consistent with NVM cell 150B, described above with reference to FIG. 5. In these embodiments, each row of NVM cells is coupled between two word lines, but differ in that the rows in the array of CMOS circuit 100G share adjacent word lines, and the rows in the array of CMOS circuit 100H do not share adjacent word lines. For example, in FIG. 10(A), the uppermost row including NVM cells 150G-1,1 to 150G-1,3 are connected between word lines W21 and W22, and the next row including NVM cells 150G-2,1 to 150G-2,3 are connected between word lines W22 and W23, whereby word line W22 is shared by these adjacent rows. In contrast, in FIG. 10(B), the uppermost row including NVM cell 150H-1,1 is connected between word lines W31 and W32, and the next row including NVM cell 150H-2,1 is connected between word lines W33 and W34 (not that one shared word line, W34, is used for each pair of rows). In order to accommodate the shared word lines, the array of CMOS IC 100G requires an extra set of bit lines that are coupled to alternating NVM cells in each column. For example, a first bit line B21 is used to select NVM cells 150G-2,1 and 150G-4,1, and a second bit line B22 is used to select NVM cells 150G-1,1 and 150G-3,1. In contrast, all of the NVM cells in each column of the array shown in FIG. 10(B) are connected to an associated (single) bit line B31 to B33.

Figure 11:
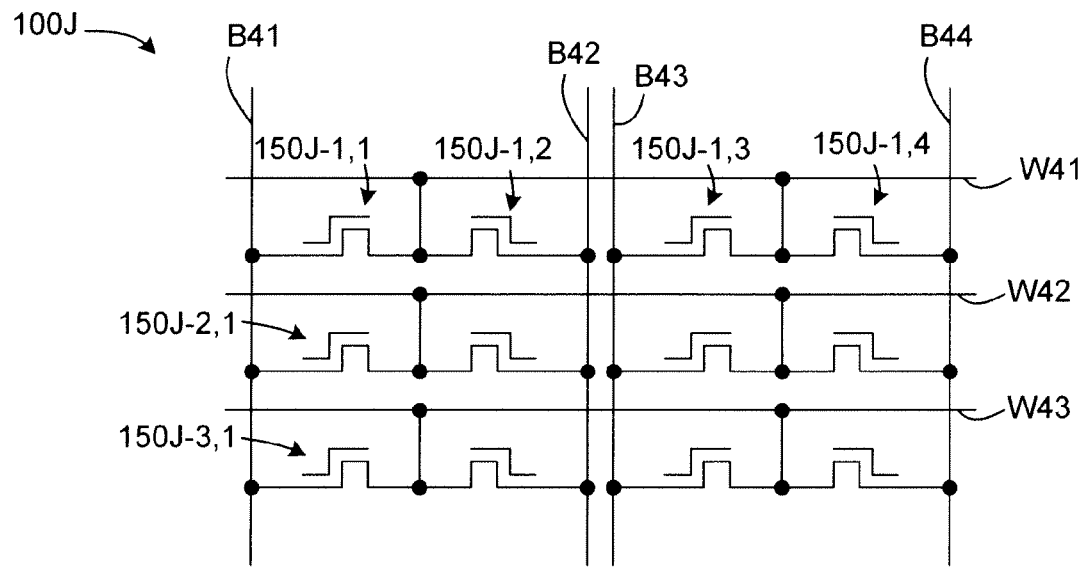
FIG. 11 is a simplified circuit diagram showing an array of asymmetric NMOS NVM cells connected to an addressing scheme according to another specific embodiment of the present invention.

FIG. 11 shows a portion of a CMOS IC 100J including an array of NVM cells arranged according to another embodiment, wherein the source regions of pairs of adjacent NVM cells in each row are connected together and to a shared word line. For example, the source regions of NVM cells 150J-1,1 and 150J-1,2 are connected to word line W41, where the drain region of NVM cell 150J-1,1 is connected to bit line B41 and the drain region of NVM cell 150J-1,2 is connected to bit line B42. Such an array arrangement allows facilitates convenient logic read-out circuitry. Each memory cell consists of two asymmetric transistors, while only one is programmed. The readout is performed by measuring potential in the point between transistors (e.g., between NVM cells 150J-1,1 and 150J-1,2). Similar to operation of a CMOS inverter, the point between transistors will have potential Vcc (from bit line B41) or 0V (from bit line B42), depending on which of the transistors is programmed. This allows low power consumption in read-out and simple read-out circuitry.

Figure 12:
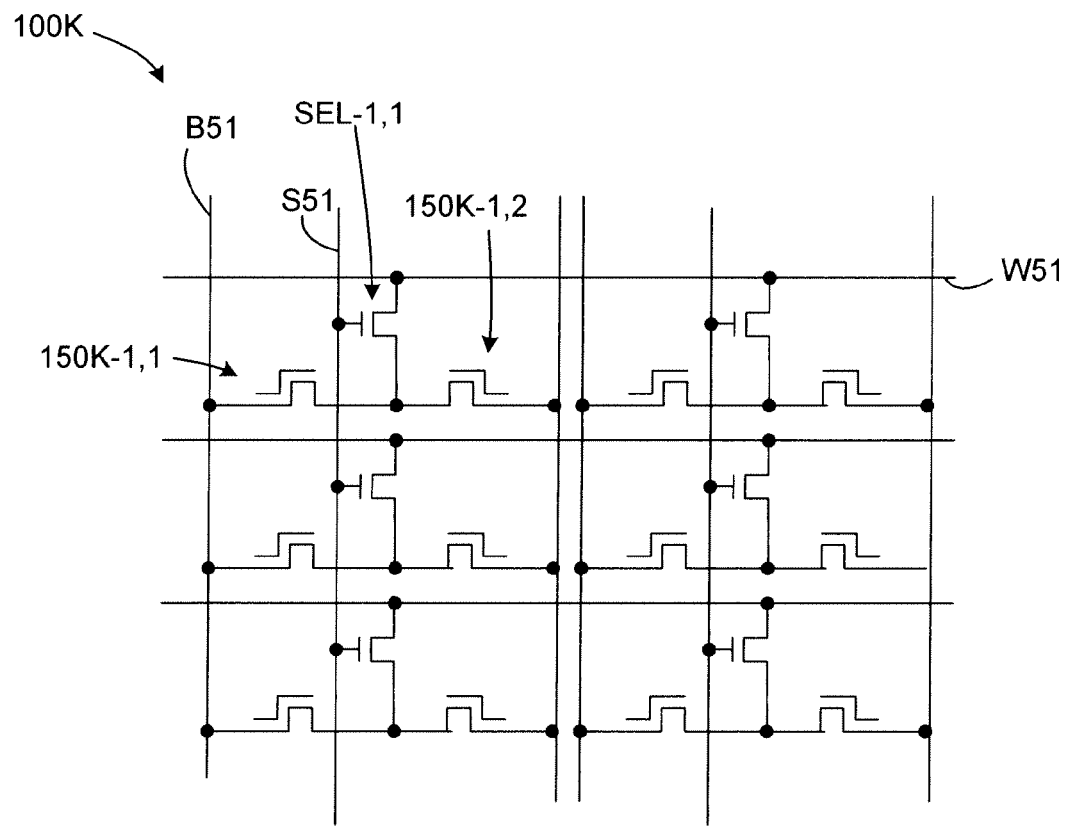
FIG. 12 is a simplified circuit diagram showing an array of asymmetric NMOS NVM cells connected to an addressing scheme according to another specific embodiment of the present invention.

In yet another embodiment shown in FIG. 12, a CMOS IC 100K includes an array of NVM cells wherein pairs of adjacent NVM cells in each row share a select transistor. For example, the source regions of NVM cells 150K-1,1 and 150K-1,2 are connected together and are coupled to word line W51 by way of select transistor SEL-1,1 where the drain region of NVM cell 150K-1,1 is connected to bit line B51 and the drain region of NVM cell 150K-1,2 is connected to bit line B52, and a select line S51 is needed to control select transistor SEL-1,1. This arrangement provides a benefit of simplifying the sensing operation at the expense of substrate area (i.e., the area needed per cell is larger, but allows $E^2$ operation).

FIGS. 13-20 include graphs showing experimentally generated data on prototype asymmetric NVM cells (on silicon) at the single cell and miniArray level.

Figure 13:
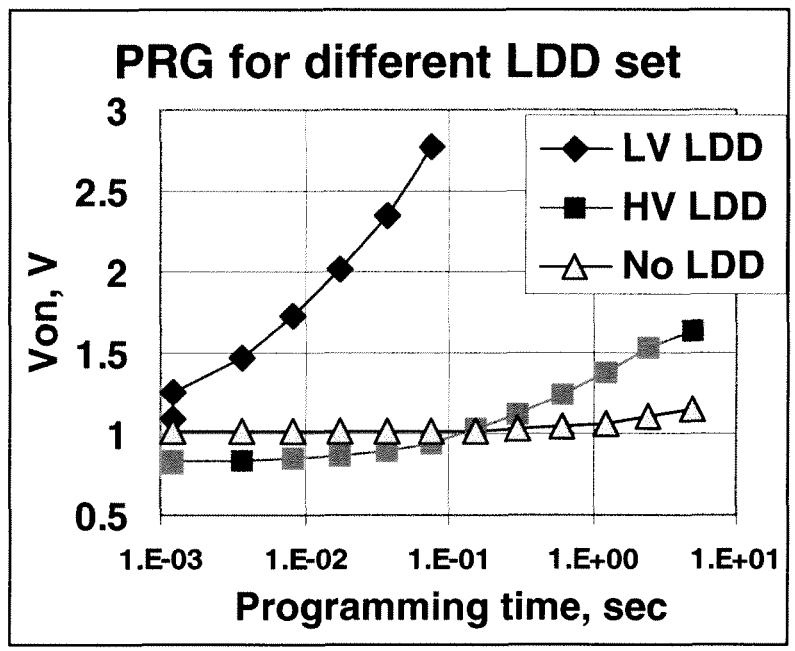
FIG. 13 is a graph showing experimental cell programming test data generated for asymmetric NMOS NVM cells formed with various drain diffusions.

FIG. 13 is a graph showing cell programming test data generated for asymmetric NMOS NVM cells formed with various drain diffusions. This graph indicates that when diffusion regions of the NVM cell (e.g., cell 100A; see FIG. 3) is treated using the LV LDD implant (only), then the programming time is reduced.

Figure 14:
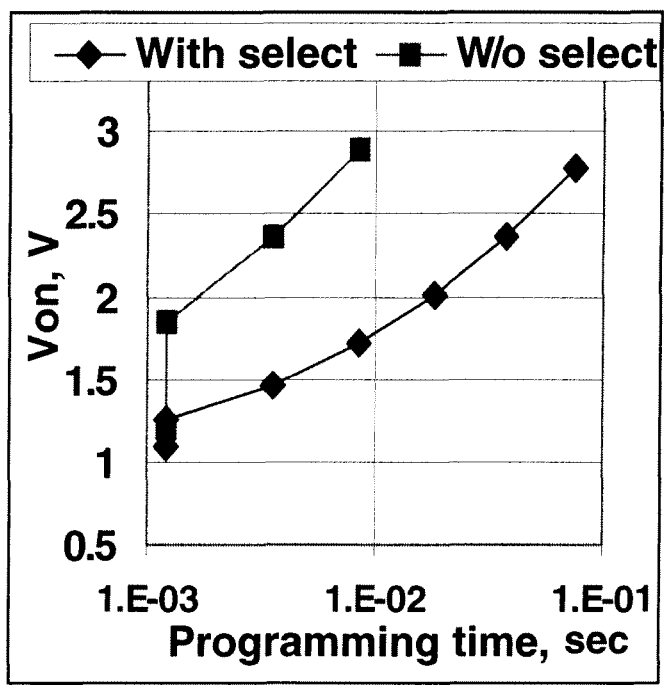
FIG. 14 is a graph showing experimental cell programming test data generated for asymmetric NMOS NVM cells formed with and without select transistors.

FIG. 14 is a graph showing cell programming test data generated for asymmetric NMOS NVM cells formed with and without select transistors. The graph shows the trade-off of using select transistors. While additional features like $E^2$ operation and immunity to over-erase are achieved, the programming time is larger.

Figure 15:
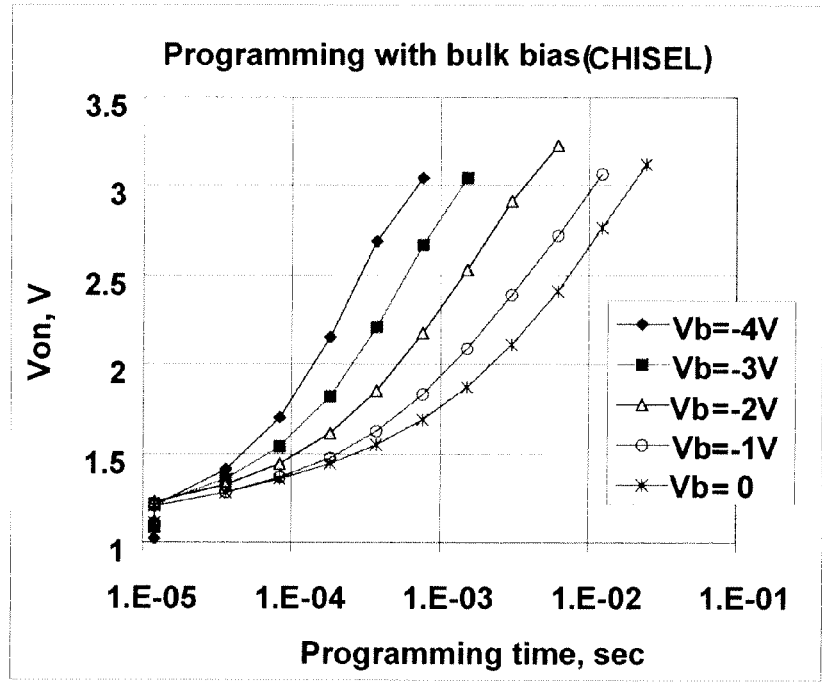
FIG. 15 is a graph showing experimental cell programming test data generated for asymmetric NMOS NVM cells using various bulk biases.

FIG. 15 is a graph showing experimental cell programming test data generated for asymmetric NMOS NVM cells using various bulk ((P-well) biases. This graph indicates that a higher bulk bias shortens the programming time needed to achieve a selected programmed state, and allows lower programming currents (not shown in the graphs) because of utilization of secondary electrons in the NVM cell programming.

Figure 16:
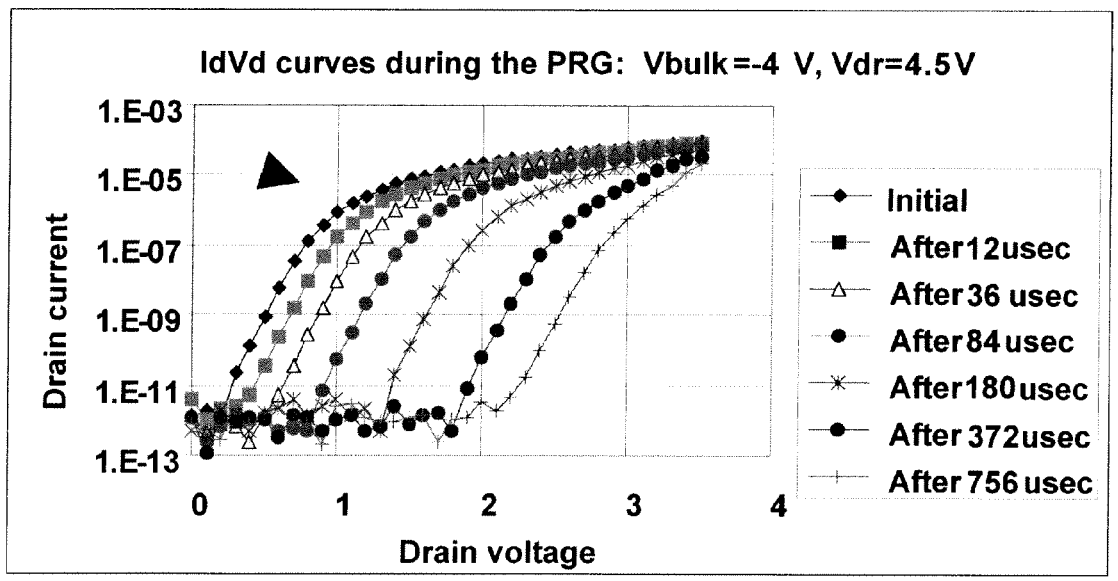
FIG. 16 is a graph showing experimental cell programming test data generated for asymmetric NMOS NVM cells indicating current/voltage characteristics for various programming times.

FIG. 16 is a graph showing experimental cell programming test data generated for asymmetric NMOS NVM cells indicating drain current/voltage characteristics for various programming times. The parallel shifts of Id(Vg) curves show high coupling ratios of the drain diffusion over the floating gate and absence of degradation.

Figure 17:
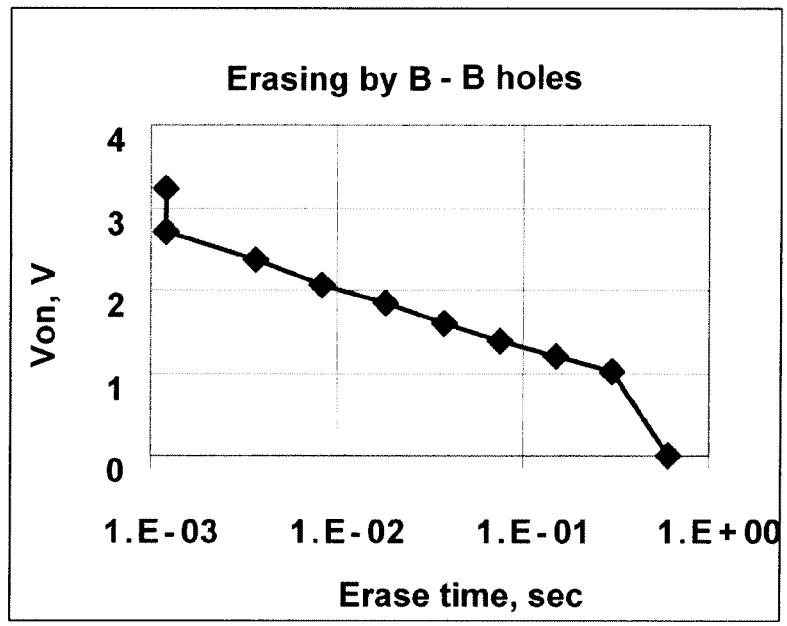
FIG. 17 is a graph showing experimental cell erasing test data generated for asymmetric NMOS NVM cells for various erase periods.

FIG. 17 is a graph showing experimental cell erasing test data generated for asymmetric NMOS NVM cells for various erase periods. High erase efficiency is evident in this graph. The last point of the Von curve is in the region of over-erase. This regime is connected with switching on an additional erase mechanism (CHE induced hot hole injection) which is intentionally avoided in the related products by keeping the drain current blocked (i.e., by keeping drain floating or using a select transistor at the drain side of the device).

Figure 18:
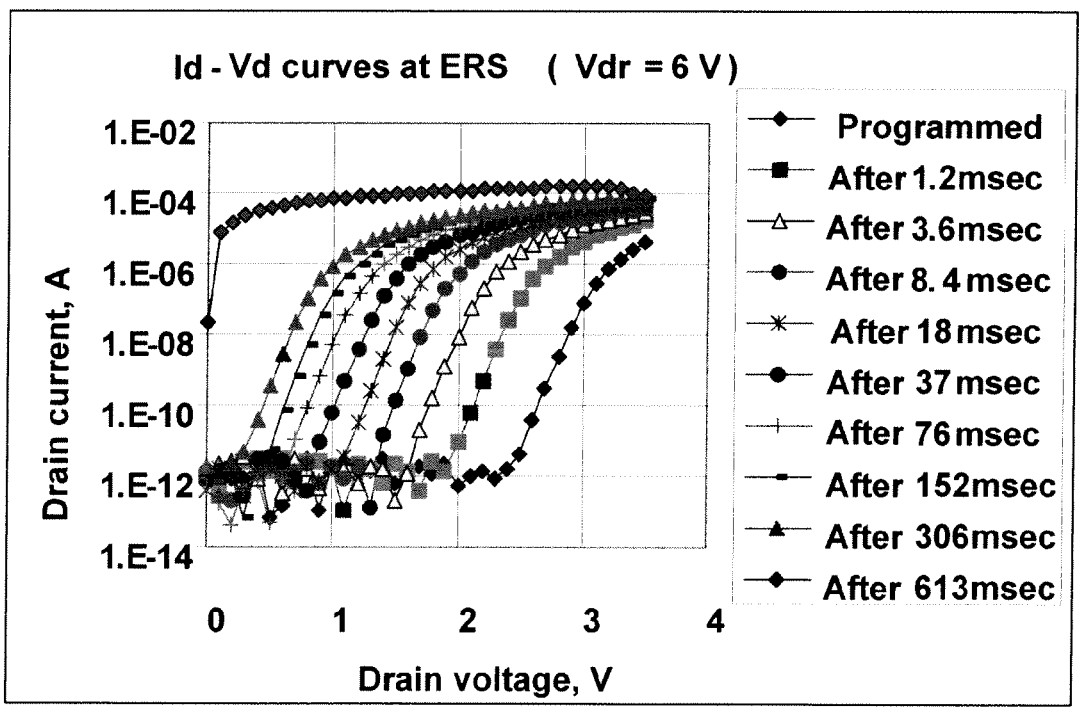
FIG. 18 is a graph showing experimental cell erasing test data generated for asymmetric NMOS NVM cells indicating current/voltage characteristics for various erasing times.

FIG. 18 is a graph showing experimental cell erasing test data generated for asymmetric NMOS NVM cells indicating drain current/voltage characteristics for various erasing times. The data is used for selecting optimum erase time in corresponding applications.

Figure 19:
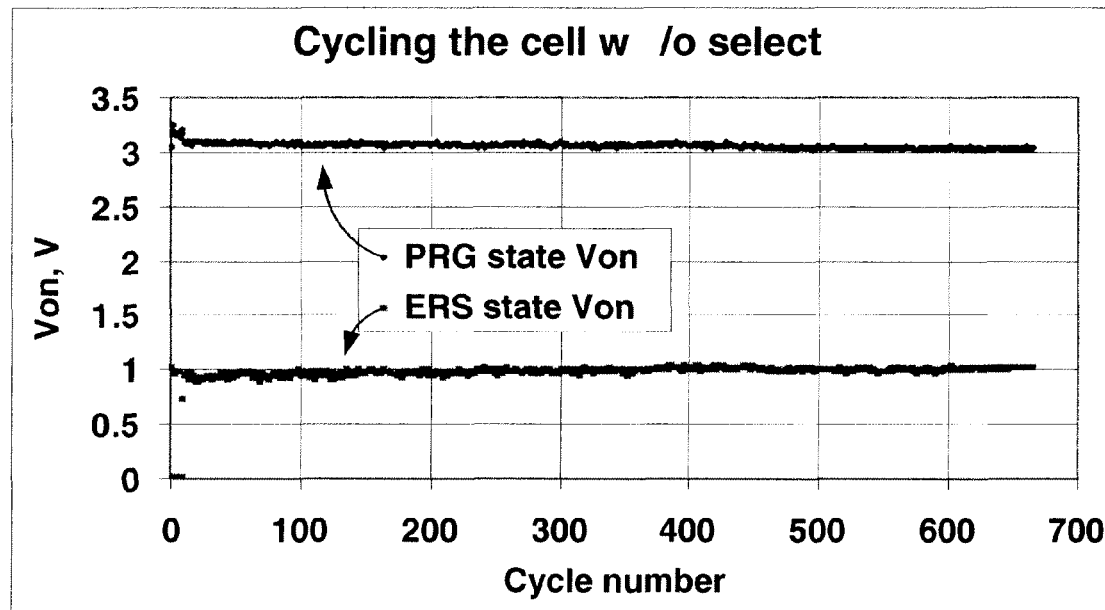
FIG. 19 is a graph showing cell program/erase cycling data generated for asymmetric NMOS NVM cells showing programmed and erased states.

FIG. 19 is a graph showing cell program/erase cycling data generated for asymmetric NMOS NVM cells showing voltage levels in the programmed and erased state. This graph indicates that the test cells retained nearly identical programmed and erased voltage levels over several hundred program/erase cycles, thereby indicating that the asymmetric NMOS NVM cells of the present invention are well suited for high endurance CMOS applications.

Figure 20:
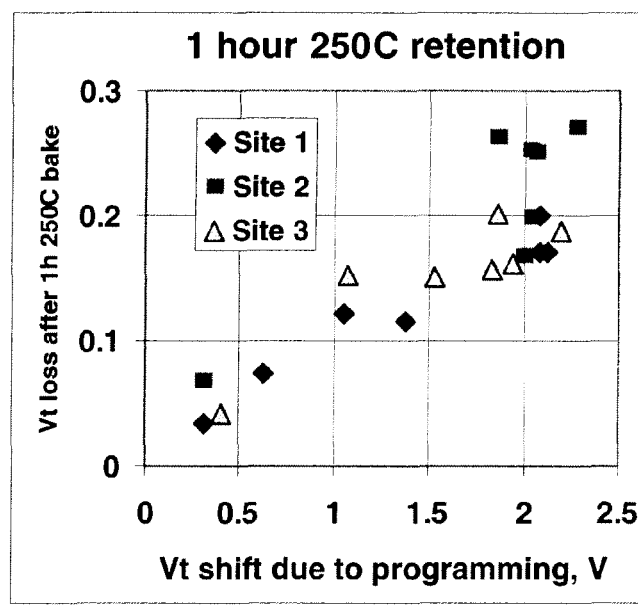
FIG. 20 is a graph showing retention data generated for asymmetric NMOS NVM cells showing voltage shifts caused by a 250° C. thermal bake for one hour.

FIG. 20 is a graph showing retention data generated for asymmetric NMOS NVM cells showing voltage shifts caused by a 250° C. thermal bake for one hour. Higher program windows result in increased retention loss (as typical for all types of floating gate memories. The data is used for operation window (programmed and erased threshold voltage (Vt) levels) selection.

Although the present invention has been described with respect to certain specific embodiments, it will be clear to those skilled in the art that the inventive features of the present invention are applicable to other embodiments as well, all of which are intended to fall within the scope of the present invention. For example, in alternative embodiments a number of different programming and erasing methods may be used, e.g., erasing with ultraviolet (UV) light, use of CHE induced hot hole injection, programming using an avalanche breakdown in the drain region, etc. In addition, a pocket implant or another special drain engineering scheme may be performed in the transistor source/drain regions to enhance lateral electrical fields and thus increase the efficiency of programming erase, while it is absent in the extension area. Moreover, although the present invention is described with reference to NMOS NVM cells, those skilled in the art will recognize that the concepts described above may be utilized to produce PMOS NVM cells having similar characteristics, e.g., a PMOS NVM cell programmed using BBT of electrons and array organization without select transistors.

The invention claimed is:

1. A complimentary metal-oxide-silicon (CMOS) integrated circuit (IC) comprising:
   a substrate;
   an asymmetric non-volatile memory (NVM) cell including:
     a source region and a drain region diffused into the substrate and separated by a channel region; and
     a polycrystalline silicon (polysilicon) polycrystalline silicon floating gate at least partially disposed over the channel region;
   a low voltage (LV) MOSFET disposed on the substrate and including a first polysilicon gate having predefined first width that is foamed on a first gate oxide having a first oxide thickness, and first lightly doped drain (LDD) regions having a first doping concentration; and
   a high voltage (HV) MOSFET disposed on the substrate and including a second polysilicon gate having predefined second width that is formed on a second gate oxide, the second gate oxide having a second oxide thickness that is greater than the first oxide thickness, the HV MOSFET also including second LDD regions having a second doping concentration,
   wherein the polycrystalline silicon floating gate, source region and drain region are formed such that a gate-drain capacitance between said polycrystalline silicon floating gate and said drain region is substantially higher than a gate-source capacitance between said polycrystalline silicon floating gate and said source region,
   wherein the CMOS IC further includes means for programming the polycrystalline silicon floating gate by transferring a positive programming potential from the drain region to the polycrystalline silicon floating gate, and for erasing the polycrystalline silicon floating gate by transferring a potential lower than 0.5V from the drain region to the polycrystalline silicon floating gate, and
   wherein the polycrystalline silicon floating gate of said asymmetric NVM cell is formed on a third gate oxide that has the second oxide thickness, and the polycrystalline silicon floating gate comprises:
     an elongated first portion disposed over the channel region such that the first portion is disposed adjacent to a first section of the drain region,
     an elongated second portion extending into a second section of the drain region, the second section being spaced from the first section, and an implanted region disposed below the second portion of the polycrystalline silicon floating gate and abutting said first section of the drain region, said implanted region having a third doping concentration including a sum of said first doping concentration and said second doping concentration.

2. The CMOS IC of claim 1, wherein the first and second portions of the polycrystalline silicon floating gate are connected by an elongated third portion such that the first, second and third portions comprise a substantially U-shaped polysilicon structure.

3. The CMOS IC of claim 1, wherein said implanted region extends entirely under said second portion of said polycrystalline silicon floating gate such that said implanted region extends between opposing edges of said drain region located below opposing side edges of said second portion.

4. The CMOS IC of claim 1, wherein said asymmetric NVM cell further comprises third LDD regions formed under said first portion of said polycrystalline silicon floating gate, wherein said third LDD regions have said first doping concentration.

5. The CMOS IC of claim 1, wherein said means for programming the polycrystalline silicon floating gate comprises means for generating channel hot electrons (CHE) in the drain region, and said means for erasing comprises means for generating band-to-band tunneling (BBT) holes in the source region.

6. The CMOS IC of claim 5, wherein said means for programming the polycrystalline silicon floating gate further comprises means for generating a first bias voltage in said channel region such that secondary electrons are generated in the channel region and injected into the polycrystalline silicon floating gate.

7. The CMOS IC of claim 6, wherein said means for programming further comprises, following a delay period of 1 to 100 microseconds after the first bias voltage is applied to the channel region, applying a first programming voltage to said drain region and a second programming voltage to said source region.

8. The CMOS IC of claim 7, wherein said means for programming further comprises generating said first and second programming voltages and bias voltage such that said first and second programming voltages are positive with respect to the bias voltage.

9. The CMOS IC of claim 1, wherein the asymmetric NVM cell further comprises a select transistor including a second source region disposed adjacent to a predetermined section of said drain region such that a second channel is defined between the second source region and the predetermined section, and a polysilicon gate structure disposed over the second channel.

10. The CMOS IC of claim 1, wherein said polycrystalline silicon floating gate further comprises a third portion extending over a third section of the drain region.

11. The CMOS IC of claim 10,
wherein the second portion extends from a first end of the first portion over the second section of the drain region,
wherein the third portion extends from a second end of the first portion over the third section of the drain region, and
wherein the first, second and third portions comprise a substantially U-shaped polysilicon structure.

12. The CMOS IC of claim 1 further comprising:
an array including a plurality of said asymmetric NVM cells arranged in rows and columns, a word line disposed parallel to an associated said row of said asymmetric NVM cells, and a bit line disposed parallel to an associated said column of said asymmetric NVM cells, wherein said word line is connected to at least one of the drain region and the source region of each NVM cell of said rows of NVM cells, and said bit line is connected to one of the source region and a select terminal of each said NVM cell of said column of NVM cells, and
means for programming and erasing a selected NVM cell by selectively applying predetermined programming voltages to said word line and said bit line.

13. The CMOS IC of claim 12, wherein the source regions of each adjacent pair of NVM cells in each row are connected together and to an associated word line.

14. An asymmetric non-volatile memory (NVM) cell comprising:
a first source region and a drain region diffused into a substrate and separated by a channel region; and
a polycrystalline silicon (polysilicon) floating gate disposed over the substrate; and
a select transistor including a second source region disposed adjacent to a predetermined section of said drain region such that a second channel is defined between the second source region and the predetermined section, and a polysilicon gate structure disposed over the second channel,
wherein the polycrystalline silicon floating gate comprises a first portion disposed over the channel region, a second portion disposed over the drain region, and a third portion connected between said first portion and said second portion, whereby a gate-drain capacitance between said polycrystalline silicon floating gate and said drain region is substantially higher than a gate-source capacitance between said polycrystalline silicon floating gate and said first source region.

15. The asymmetric NVM cell of claim 14, wherein the first, second and third portions comprise a substantially U-shaped polycrystalline silicon structure.

16. The asymmetric NVM cell of claim 14, further comprising an implanted region disposed below the second portion of the polycrystalline silicon floating gate, said implanted region extending entirely under said second portion of said polycrystalline silicon floating gate such that said implanted region extends between opposing edges of said drain region located below opposing side edges of said second portion.

17. The asymmetric NVM cell of claim 14,
wherein said asymmetric NVM cell further comprises first LDD regions formed under said first portion of said polycrystalline silicon floating gate, wherein said first LDD regions have a first doping concentration,
wherein said select transistor further comprises second LDD regions formed under said polysilicon gate structure having a second doping concentration, the second doping concentration being greater than the first doping concentration, and
wherein said asymmetric NVM cell further comprises an implanted region disposed below the second portion of the polycrystalline silicon floating gate, said implanted region having third doping concentration, said third doping concentration being greater than said first doping concentration and said second doping concentration.

* * * * *